US006690612B2

(12) United States Patent
Gall et al.

(10) Patent No.: US 6,690,612 B2
(45) Date of Patent: Feb. 10, 2004

(54) VOLTAGE SUPPLY FOR SEMICONDUCTOR MEMORY

(75) Inventors: Martin Gall, München (DE); Andre Schaefer, München (DE)

(73) Assignee: Infineon Technologies AG, Munich (DE)

( * ) Notice: Subject to any disclaimer, the term of this patent is extended or adjusted under 35 U.S.C. 154(b) by 110 days.

(21) Appl. No.: 10/012,851

(22) Filed: Oct. 30, 2001

(65) Prior Publication Data

US 2002/0141274 A1 Oct. 3, 2002

(30) Foreign Application Priority Data

Oct. 30, 2000 (DE) .......................................... 100 53 831

(51) Int. Cl.[7] ................................................ G11C 7/00
(52) U.S. Cl. ......................... 365/226; 710/100; 714/37
(58) Field of Search ............................ 365/226, 51, 52, 365/63; 710/100; 714/42, 43, 37; 327/321

(56) References Cited

U.S. PATENT DOCUMENTS 6,184,737 B1 * 2/2001 Taguchi
6,271,704 B1 * 8/2001 Babcock et al.
6,308,232 B1 * 10/2001 Gasbarro
6,357,018 B1 * 3/2002 Stuewe et al.
6,438,012 B1 * 8/2002 Osaka et al.
6,480,409 B2 * 11/2002 Park et al.

FOREIGN PATENT DOCUMENTS

DE    43 22 658 A1    1/1994
DE    44 45 846 A1    6/1996

* cited by examiner

Primary Examiner—Michael S. Lebentritt
Assistant Examiner—Hien Nguyen
(74) Attorney, Agent, or Firm—Laurence A. Greenberg; Werner H. Stemer; Gregory L. Mayback

(57) ABSTRACT

The invention relates to a voltage supply arrangement for a semiconductor memory with a bus system that is terminated on one side. A terminating voltage supply and a terminating resistor are integrated into a DRAM. The terminating resistor and the terminating voltage supply are extremely stable, so that parasitic events in the terminating resistor are practically precluded.

5 Claims, 1 Drawing Sheet

VOLTAGE SUPPLY FOR SEMICONDUCTOR MEMORY

BACKGROUND OF THE INVENTION

1. Field of the Invention

The present invention relates to a voltage supply arrangement for a semiconductor device, particularly a semiconductor memory arrangement, with a controller and a bus system, which is connected on one side to the controller and on the other side, by way of a terminating resistor, to a terminating voltage supply, and to which the semiconductor memory arrangement is connected.

DE 44 45 846 A1 describes a circuit arrangement for the termination of a line leading to an integrated CMOS circuit. As the terminating resistor, a field-effect transistor is disposed in the integrated circuit. A p-channel FET is used, because the total supply voltage equals 0 V.

DE 43 22 658 A1 describes a terminating resistor circuit for a bus line in which a current source line, a signal line, and a grounding line are connected between computer devices via respective terminations. An input terminal of a controller is connected to the current source line, and the termination is provided between the output termination of the controller and the signal line. A Zener diode is located between the output terminal and the grounding line in such a way that the cathode terminal and the anode terminal are connected to the output terminal of the controller and the grounding line, respectively.

FIG. 2 represents an existing voltage supply arrangement for a semiconductor memory arrangement 1 composed of DRAMs D1, D2, . . . , Dn. This semiconductor memory arrangement 1 is connected to a bus system 2, which is located on a printed circuit board PCB. This bus system 2 is connected at one end to a memory controller MEMC, specifically a driver DRV and a receiver REC. Some other semiconductor device can be connected to the voltage supply arrangement instead of a semiconductor memory arrangement.

At its other end on the output side, the bus system 2 comprises an external terminating resistor Rterm which is provided on a printed circuit board PCB in SMD technology and additionally connected to an external voltage supply Vtt that lies between the potential VSS and this external terminating resistor Rterm. This external voltage supply Vtt can be a transformer with a voltage regulating element. The terminating voltage which is delivered by the external voltage supply Vtt is set such that an input/output circuit—that is, an I/O circuit I/O for the memory controller MEMC and the DRAMs D1, D2, . . . , Dn which drives the semiconductor memory arrangement 1 via the bus system 2—is at a suitable operating point for the operation. To accomplish this, the terminal resistor Rterm absorbs a wave sent over the bus system 2 by the memory controller MEMC or the DRAMs D1, D2, . . . , Dn and is thereby rated such that its resistance value corresponds to the characteristic impedance of the line of the bus system 2.

By virtue of the external construction of the terminating resistor Rterm and terminating voltage supply Vtt, the desirable progressive increase of the packing density of the voltage supply arrangement for the semiconductor memory device 1 is limited not by the memory controller MEMC or the bus system 2, but rather by the external wiring of this terminating resistor Rterm and voltage supply Vtt. In other words, it is impossible to achieve higher packing densities owing to this external wiring, which consumes a large amount of space.

A further disadvantage of the existing voltage supply arrangement is that the terminating resistor Rterm is mounted on the printed circuit board PCB by the SMD technique. As a consequence of the SMD assembly, the parasitic effects of the terminating resistor Rterm effectuate a reduction of the terminating bandwidth.

SUMMARY OF THE INVENTION

It is thus the object of the invention to lay out a voltage supply arrangement for a semiconductor memory arrangement wherein the terminating resistor and the terminating supply voltage are extremely stable, so that parasitic events in the terminating resistor are practically precluded.

With the foregoing and other objects in view there is provided, in accordance with the invention, a semiconductor memory system including a controller; a bus system having a first side that is connected to the controller; and a semiconductor memory configuration including a plurality of DRAMs that are connected to the bus system. Each one of the plurality of the DRAMs includes a terminating resistor integrated therein and a terminating voltage supply integrated therein. The plurality of the DRAMs include a furthest away DRAM that is connected to the bus system at a location that is further away from the controller than any others of the plurality of the DRAMs. Only the terminating voltage supply of the furthest away DRAM and the terminating resistor of the furthest away DRAM are active. The terminating resistor of the furthest away DRAM connects the terminating voltage supply of the furthest away DRAM to a second side of the bus system.

The semiconductor memory arrangement consists of a plurality of DRAMs, with a terminating resistor and a terminating voltage supply integrated in each DRAM. But in this type of semiconductor memory arrangement consisting of a plurality of DRAMs, only the terminating voltage supply and the terminating resistor of the most suitable DRAM with respect to the bus, namely the DRAM most remote from the memory controller on the bus system, are active. It is possible to furnish all DRAMs with a terminating resistor and a terminating voltage supply, so that the DRAMs can be produced in an identical manner. When the DRAMs are then connected to the bus system, an appropriate DRAM with respect to the bus, namely the last DRAM on the bus system, taking as the starting point the memory controller, is active with respect to its terminating resistor and terminating voltage supply, whereas in all other DRAMs the terminating resistor and terminating voltage supply remain inactive.

This way, the terminating resistor and the terminating voltage supply are integrated into the semiconductor memory arrangement, so that an external wiring for the terminating resistor and terminating voltage supply can be forgone.

As a consequence of the integration of the terminating resistor and the terminating voltage supply into the individual DRAMs, or into the semiconductor memory arrangement generally, parasitic events are reduced, and ground bounce effects may also be drastically reduced. Besides this, the packing density can be substantially increased, there no longer being any limitation resulting from an external wiring for the terminating resistor and terminating voltage supply.

DESCRIPTION OF THE PREFERRED EMBODIMENTS

Figure 1:
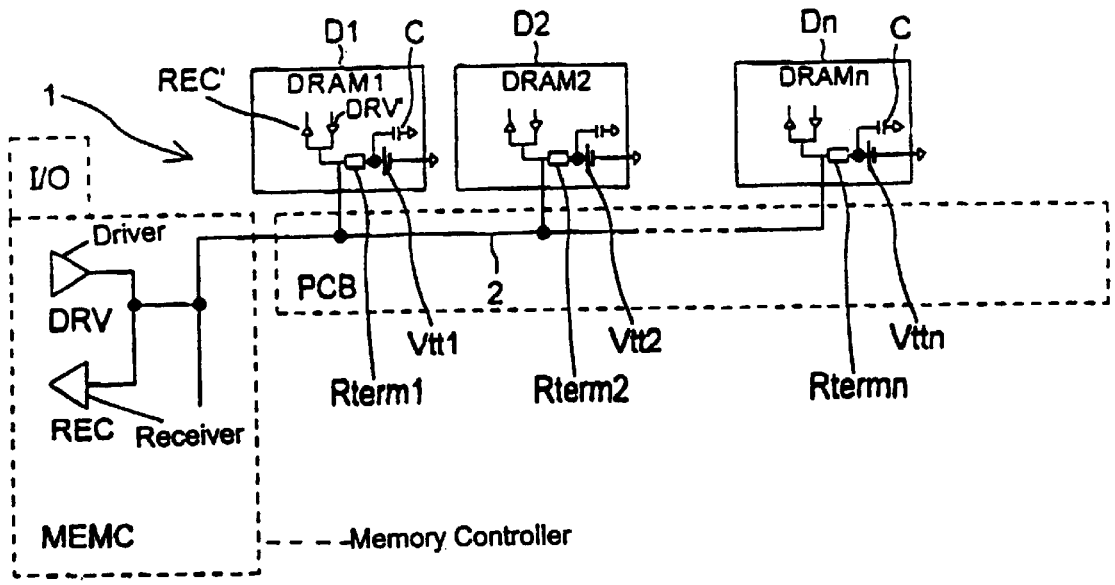
FIG. 1 is a schematic circuit diagram of an inventive voltage supply arrangement.
Figure 2:
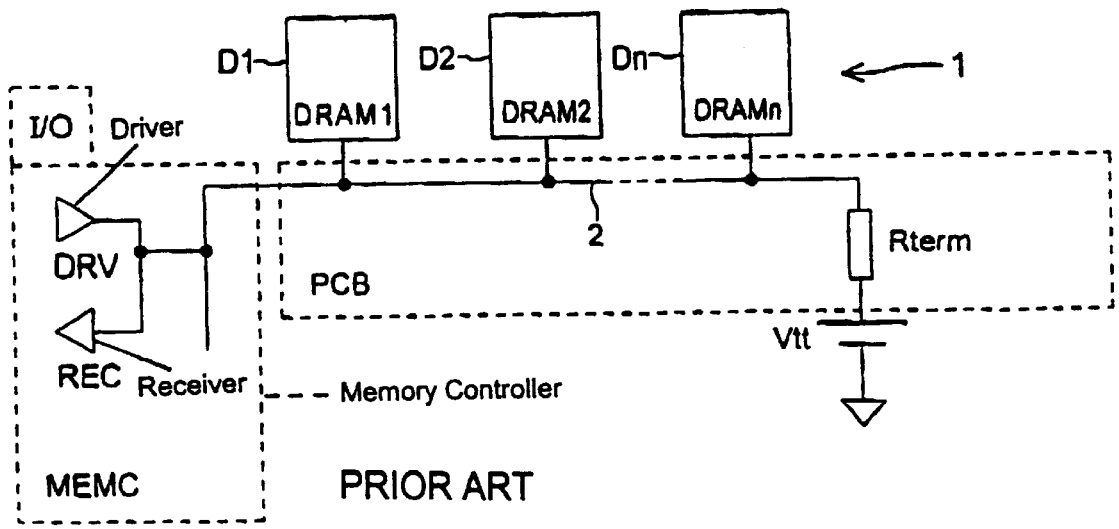
FIG. 2 is a schematic circuit diagram of a prior art voltage supply arrangement.

FIG. 2 has already been described. FIG. 1 includes the same reference characters used in FIG. 1 for corresponding parts.

In the inventive voltage supply arrangement an internal terminating resistor Rterm1, Rterm2, . . . , Rtermn and an internal terminating voltage supply Vtt1, Vtt2, . . . , Vttn, which is bypassed by a capacitor C as a high-frequency short, are provided in each DRAM D1, D2, . . . , Dn. The terminating resistors Rterm1, Rterm2, . . . , Rtermn can typically consist of integrated resistors, for instance film resistors and the like, whereas voltage pumps or voltage splitters can be used for the terminating voltage supplies Vtt1, Vtt2, . . . , Vttn. A voltage pump is utilized when the terminating voltage supply Vtt is to have a higher value than the highest external voltage.

In their active embodiment, the terminating resistors Rterm1, Rterm2, . . . , Rtermn and/or the terminating voltage supplies Vtt1, Vtt2, . . . , Vttn are adjustable, their values being adaptable to the characteristic impedance of the line formed by the bus system 2.

The DRAMs D1, D2, . . . , Dn are all produced with their terminating resistors Rterm1, Rterm2, . . . , Rtermn and their terminating voltage supplies Vtt1, Vtt2, . . . , Vttn, although only the DRAM Dn, which is the last DRAM along the bus system 2, taking as the starting point the memory controller MEMC, (i.e. the most suitable DRAM with respect to the bus), requires the terminating resistor Rtermn and the terminating voltage supply Vttn per se, in order to terminate the bus system properly. This guarantees a standardized production of all DRAMs D1, D2, . . . , Dn.

The non-required terminating resistors Rterm1, Rterm2, . . . , Rterm(n−1) and terminating voltage supplies Vtt1, Vtt2, . . . , Vtt(n−1), which are located in the DRAMs "before" the last DRAM Dn along the bus system 2, are switched off, i.e. deactivated, (cf. "off" in DRAM 1 and DRAM 2), so that only the terminating resistor Rtermn and the terminating voltage supply Vttn in the "last" DRAM Dn are active.

The "last" DRAM in the above example need not necessarily be DRAM Dn. Rather, this can refer to any DRAM which guarantees the integrity of the signals transmitted on the bus system 2, and which it is reasonable to select in view of the bus technology.

As a result of the adjustability of the terminating resistor Rtermn and the terminating voltage supply Vttn—that is, the ability to control them—it is possible to achieve excellent adapting of the termination of the bus system 2 to its impedance, thereby substantially suppressing parasitic events and sharply reducing ground-bounce effects. The integrated form of the terminating resistors and terminating voltage supply as opposed to the SMD assembly thereof on the printed circuit PCB also contributes to this.

In addition, the packing density can be substantially increased, because an external wiring for the terminating resistor and the terminating voltage supply can be forgone.

The terminating resistor and terminating voltage supply are parallel to the input of the respective DRAMs D1, D2, . . . , Dn, the remaining wiring of which is represented schematically by a driver DRV' and a receiver REC'.

We claim:

1. A semiconductor memory system, comprising:

a controller;

a bus system having a first side connected to said controller and having a second side;

a semiconductor memory configuration including a plurality of DRAMs connected to said bus system;

each one of said plurality of said DRAMs including a terminating resistor integrated therein and a terminating voltage supply integrated therein;

said plurality of said DRAMs including a furthest away DRAM that is connected to said bus system at a location that is further away from said controller than any others of said plurality of said DRAMs;

only said terminating voltage supply of said furthest away DRAM and said terminating resistor of said furthest away DRAM being active while said terminating voltage supply and terminating resistor of all others of said plurality of said DRAMs are deactivated; and said terminating resistor of said furthest away DRAM connecting said terminating voltage supply of said furthest away DRAM to said second side of said bus system.

2. The semiconductor memory system according to claim 1, wherein: said terminating voltage supply of said furthest away DRAM is a Vtt voltage supply.

3. The semiconductor memory system according to claim 2, comprising:

a printed circuit board;

said bus system being disposed on said printed circuit board.

4. The semiconductor memory system according to claim 2, wherein;

an external voltage is present that is higher than any other voltage that is present; and said Vtt voltage supply supplies a voltage corresponding to the external voltage.

5. The semiconductor memory system according to claim 1, comprising:

a printed circuit board;

said bus system being disposed on said printed circuit board.

* * * * *